United States Patent
Dubucq et al.

(10) Patent No.: US 9,998,147 B1
(45) Date of Patent: Jun. 12, 2018

(54) METHOD FOR USING WRITE INTENTS IN A DISTRIBUTED STORAGE NETWORK

(71) Applicant: International Business Machines Corporation, Armonk, NY (US)

(72) Inventors: Thomas Dubucq, Chicago, IL (US);
Jeremy S. Jarczyk, Lombard, IL (US);
Ravi V. Khadiwala, Bartlett, IL (US);
Manish Motwani, Chicago, IL (US);
Renars W. Narubin, Chicago, IL (US);
Jason K. Resch, Chicago, IL (US);
Daniel J. Scholl, Chicago, IL (US);
Yogesh R. Vedpathak, Chicago, IL (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/442,744

(22) Filed: Feb. 27, 2017

(51) Int. Cl.
| | | |
|---|---|---|
| H03M 13/05 | (2006.01) | |
| H04L 29/08 | (2006.01) | |
| G06F 3/06 | (2006.01) | |
| H03M 13/00 | (2006.01) | |

(52) U.S. Cl.
CPC ............ *H03M 13/05* (2013.01); *G06F 3/067* (2013.01); *G06F 3/0619* (2013.01); *G06F 3/0659* (2013.01); *H03M 13/6566* (2013.01); *H04L 67/1097* (2013.01)

(58) Field of Classification Search
None
See application file for complete search history.

(56) References Cited

U.S. PATENT DOCUMENTS

| | | |
|---|---|---|
| 4,092,732 A | 5/1978 | Ouchi |
| 5,454,101 A | 9/1995 | Mackay et al. |
| 5,485,474 A | 1/1996 | Rabin |
| 5,774,643 A | 6/1998 | Lubbers et al. |
| 5,802,364 A | 9/1998 | Senator et al. |
| 5,809,285 A | 9/1998 | Hilland |
| 5,890,156 A | 3/1999 | Rekieta et al. |
| 5,987,622 A | 11/1999 | Lo Verso et al. |
| 5,991,414 A | 11/1999 | Garay et al. |
| 6,012,159 A | 1/2000 | Fischer et al. |
| 6,058,454 A | 5/2000 | Gerlach et al. |
| 6,128,277 A | 10/2000 | Bruck et al. |

(Continued)

OTHER PUBLICATIONS

Shamir; How to Share a Secret; Communications of the ACM; vol. 22, No. 11; Nov. 1979; pp. 612-613.

(Continued)

*Primary Examiner* — Mujtaba M Chaudry
(74) *Attorney, Agent, or Firm* — Garlick & Markison; Timothy W. Markison; Kelly H. Hale

(57) ABSTRACT

A method beings by a computing device receiving a write request for a data segment that has been encoded to produce a set of encoded data slices. The method continues with the write request being stored in memory and a write intent associated with the write request being created and stored as an object in memory. The computing device then determines whether metadata associated with the data segment can be updated, and when the metadata cannot be updated maintaining the write request in memory until a cleanup agent can execute the write intent and successfully update the metadata.

20 Claims, 8 Drawing Sheets

(56) References Cited

U.S. PATENT DOCUMENTS

| | | | |
|---|---|---|---|
| 6,175,571 B1 | 1/2001 | Haddock et al. | |
| 6,192,472 B1 | 2/2001 | Garay et al. | |
| 6,256,688 B1 | 7/2001 | Suetaka et al. | |
| 6,272,658 B1 | 8/2001 | Steele et al. | |
| 6,301,604 B1 | 10/2001 | Nojima | |
| 6,356,949 B1 | 3/2002 | Katsandres et al. | |
| 6,366,995 B1 | 4/2002 | Vilkov et al. | |
| 6,374,336 B1 | 4/2002 | Peters et al. | |
| 6,415,373 B1 | 7/2002 | Peters et al. | |
| 6,418,539 B1 | 7/2002 | Walker | |
| 6,449,688 B1 | 9/2002 | Peters et al. | |
| 6,567,948 B2 | 5/2003 | Steele et al. | |
| 6,571,282 B1 | 5/2003 | Bowman-Amuah | |
| 6,609,223 B1 | 8/2003 | Wolfgang | |
| 6,718,361 B1 | 4/2004 | Basani et al. | |
| 6,760,808 B2 | 7/2004 | Peters et al. | |
| 6,785,768 B2 | 8/2004 | Peters et al. | |
| 6,785,783 B2 | 8/2004 | Buckland | |
| 6,826,711 B2 | 11/2004 | Moulton et al. | |
| 6,879,596 B1 | 4/2005 | Dooply | |
| 7,003,688 B1 | 2/2006 | Pittelkow et al. | |
| 7,024,451 B2 | 4/2006 | Jorgenson | |
| 7,024,609 B2 | 4/2006 | Wolfgang et al. | |
| 7,080,101 B1 | 7/2006 | Watson et al. | |
| 7,103,824 B2 | 9/2006 | Halford | |
| 7,103,915 B2 | 9/2006 | Redlich et al. | |
| 7,111,115 B2 | 9/2006 | Peters et al. | |
| 7,140,044 B2 | 11/2006 | Redlich et al. | |
| 7,146,644 B2 | 12/2006 | Redlich et al. | |
| 7,171,493 B2 | 1/2007 | Shu et al. | |
| 7,222,133 B1 * | 5/2007 | Raipurkar | G06F 11/1458 707/642 |
| 7,240,236 B2 | 7/2007 | Cutts et al. | |
| 7,272,613 B2 | 9/2007 | Sim et al. | |
| 7,636,724 B2 | 12/2009 | de la Torre et al. | |
| 8,532,212 B2 * | 9/2013 | Ito | H04B 7/0452 375/267 |
| 8,892,598 B2 * | 11/2014 | Motwani | H04L 63/06 707/770 |
| 2002/0062422 A1 | 5/2002 | Butterworth et al. | |
| 2002/0166079 A1 | 11/2002 | Ulrich et al. | |
| 2003/0018927 A1 | 1/2003 | Gadir et al. | |
| 2003/0037261 A1 | 2/2003 | Meffert et al. | |
| 2003/0065617 A1 | 4/2003 | Watkins et al. | |
| 2003/0084020 A1 | 5/2003 | Shu | |
| 2004/0024963 A1 | 2/2004 | Talagala et al. | |
| 2004/0122917 A1 | 6/2004 | Menon et al. | |
| 2004/0215998 A1 | 10/2004 | Buxton et al. | |
| 2004/0228493 A1 | 11/2004 | Ma et al. | |
| 2005/0100022 A1 | 5/2005 | Ramprashad | |
| 2005/0114594 A1 | 5/2005 | Corbett et al. | |
| 2005/0125593 A1 | 6/2005 | Karpoff et al. | |
| 2005/0131993 A1 | 6/2005 | Fatula, Jr. | |
| 2005/0132070 A1 | 6/2005 | Redlich et al. | |
| 2005/0144382 A1 | 6/2005 | Schmisseur | |
| 2005/0193128 A1 * | 9/2005 | Dawson | H04L 67/1097 709/229 |
| 2005/0229069 A1 | 10/2005 | Hassner | |
| 2006/0047907 A1 | 3/2006 | Shiga et al. | |
| 2006/0136448 A1 | 6/2006 | Cialini et al. | |
| 2006/0156059 A1 | 7/2006 | Kitamura | |
| 2006/0224603 A1 | 10/2006 | Correll, Jr. | |
| 2007/0079081 A1 | 4/2007 | Gladwin et al. | |
| 2007/0079082 A1 | 4/2007 | Gladwin et al. | |
| 2007/0079083 A1 | 4/2007 | Gladwin et al. | |
| 2007/0088970 A1 | 4/2007 | Buxton et al. | |
| 2007/0174192 A1 | 7/2007 | Gladwin et al. | |
| 2007/0214285 A1 | 9/2007 | Au et al. | |
| 2007/0234110 A1 * | 10/2007 | Soran | G06F 3/0608 714/6.22 |
| 2007/0283167 A1 | 12/2007 | Venters, III et al. | |
| 2009/0094251 A1 | 4/2009 | Gladwin et al. | |
| 2009/0094318 A1 | 4/2009 | Gladwin et al. | |
| 2010/0023524 A1 | 1/2010 | Gladwin et al. | |
| 2011/0066808 A1 * | 3/2011 | Flynn | G06F 12/0246 711/118 |
| 2012/0166757 A1 * | 6/2012 | Volvovski | G06F 17/30 711/206 |
| 2013/0013761 A1 * | 1/2013 | Grube | H04L 65/4084 709/223 |
| 2014/0143213 A1 * | 5/2014 | Tal | G06F 17/30156 707/692 |
| 2014/0351624 A1 * | 11/2014 | Resch | H04L 67/06 714/6.2 |
| 2015/0242273 A1 * | 8/2015 | Resch | G06F 11/1092 714/763 |
| 2016/0154698 A1 * | 6/2016 | Kazi | G06F 11/1092 714/766 |
| 2016/0188218 A1 * | 6/2016 | Gray | H04L 67/1097 711/165 |
| 2016/0239384 A1 * | 8/2016 | Slik | G06F 11/1076 |

OTHER PUBLICATIONS

Rabin; Efficient Dispersal of Information for Security, Load Balancing, and Fault Tolerance; Journal of the Association for Computer Machinery; vol. 36, No. 2; Apr. 1989; pp. 335-348.

Chung; An Automatic Data Segmentation Method for 3D Measured Data Points; National Taiwan University; pp. 1-8; 1998.

Plank, T1: Erasure Codes for Storage Applications; FAST2005, 4th Usenix Conference on File Storage Technologies; Dec. 13-16, 2005; pp. 1-74.

Wildi; Java iSCSi Initiator; Master Thesis; Department of Computer and Information Science, University of Konstanz; Feb. 2007; 60 pgs.

Legg; Lightweight Directory Access Protocol (LDAP): Syntaxes and Matching Rules; IETF Network Working Group; RFC 4517; Jun. 2006; pp. 1-50.

Zeilenga; Lightweight Directory Access Protocol (LDAP): Internationalized String Preparation; IETF Network Working Group; RFC 4518; Jun. 2006; pp. 1-14.

Smith; Lightweight Directory Access Protocol (LDAP): Uniform Resource Locator; IETF Network Working Group; RFC 4516; Jun. 2006; pp. 1-15.

Smith; Lightweight Directory Access Protocol (LDAP): String Representation of Search Filters; IETF Network Working Group; RFC 4515; Jun. 2006; pp. 1-12.

Zeilenga; Lightweight Directory Access Protocol (LDAP): Directory Information Models; IETF Network Working Group; RFC 4512; Jun. 2006; pp. 1-49.

Sciberras; Lightweight Directory Access Protocol (LDAP): Schema for User Applications; IETF Network Working Group; RFC 4519; Jun. 2006; pp. 1-33.

Harrison; Lightweight Directory Access Protocol (LDAP): Authentication Methods and Security Mechanisms; IETF Network Working Group; RFC 4513; Jun. 2006; pp. 1-32.

Zeilenga; Lightweight Directory Access Protocol (LDAP): Technical Specification Road Map; IETF Network Working Group; RFC 4510; Jun. 2006; pp. 1-8.

Zeilenga; Lightweight Directory Access Protocol (LDAP): String Representation of Distinguished Names; IETF Network Working Group; RFC 4514; Jun. 2006; pp. 1-15.

Sermersheim; Lightweight Directory Access Protocol (LDAP): The Protocol; IETF Network Working Group; RFC 4511; Jun. 2006; pp. 1-68.

Satran, et al.; Internet Small Computer Systems Interface (iSCSI); IETF Network Working Group; RFC 3720; Apr. 2004; pp. 1-257.

Xin, et al.; Evaluation of Distributed Recovery in Large-Scale Storage Systems; 13th IEEE International Symposium on High Performance Distributed Computing; Jun. 2004; pp. 172-181.

Kubiatowicz, et al.; OceanStore: An Architecture for Global-Scale Persistent Storage; Proceedings of the Ninth International Conference on Architectural Support for Programming Languages and Operating Systems (ASPLOS 2000); Nov. 2000; pp. 1-12.

\* cited by examiner

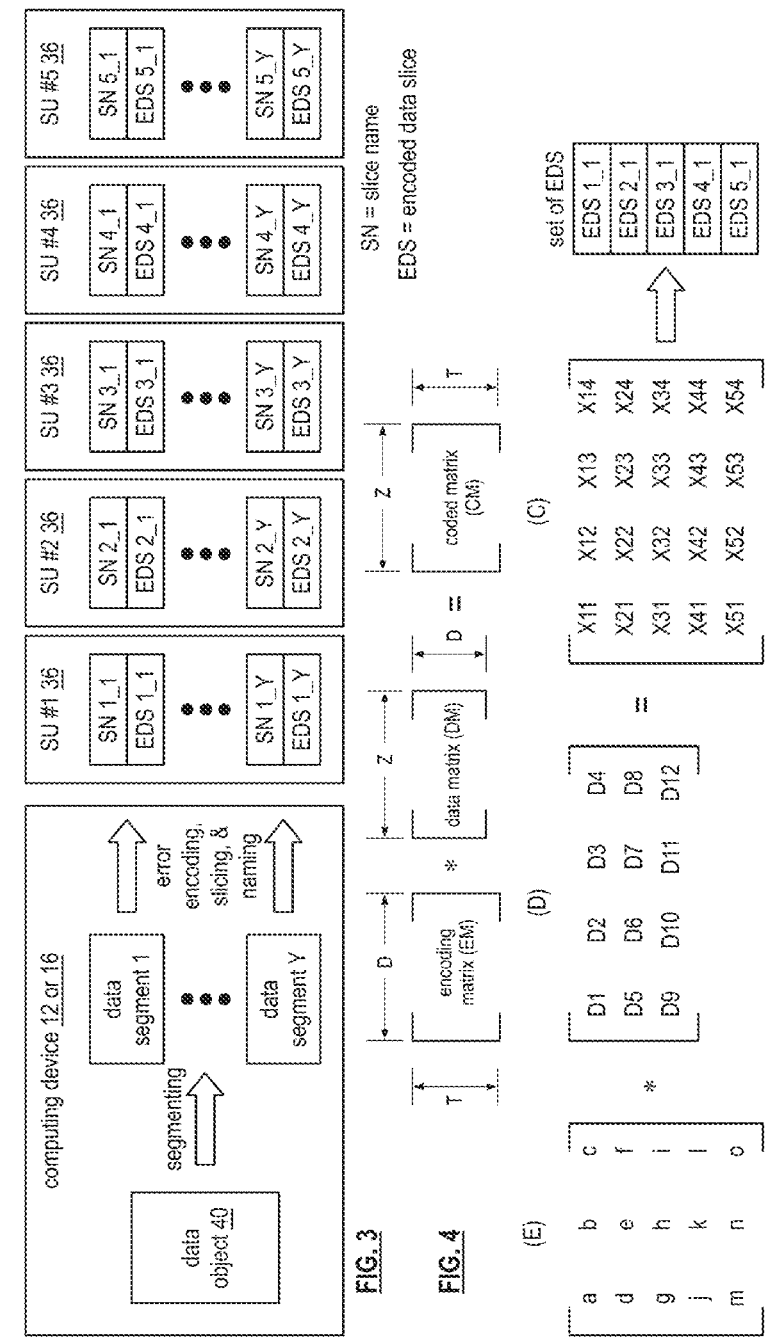

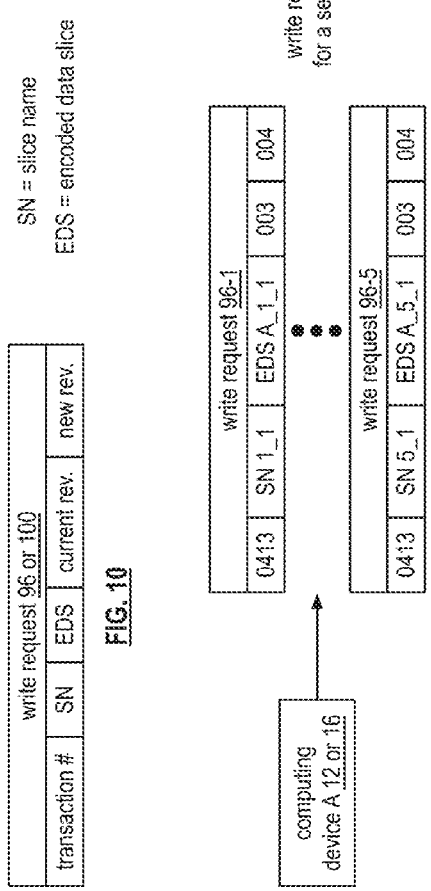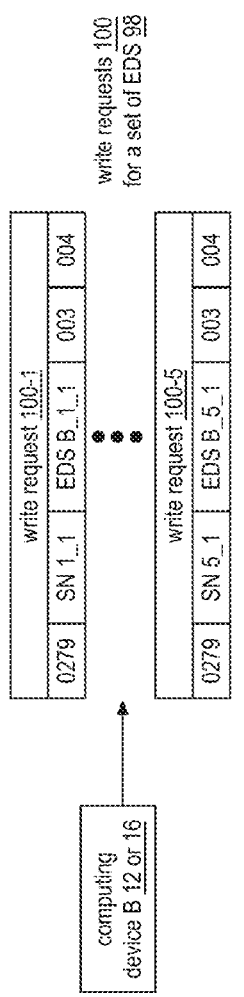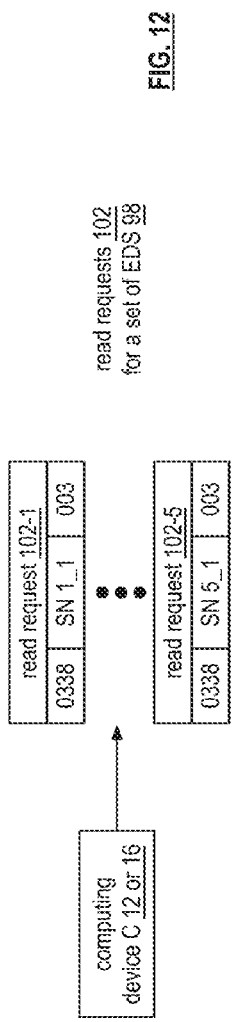
FIG. 10
FIG. 11
FIG. 12

METHOD FOR USING WRITE INTENTS IN A DISTRIBUTED STORAGE NETWORK

STATEMENT REGARDING FEDERALLY SPONSORED RESEARCH OR DEVELOPMENT

Not applicable.

INCORPORATION-BY-REFERENCE OF MATERIAL SUBMITTED ON A COMPACT DISC

Not applicable.

BACKGROUND OF THE INVENTION

Technical Field of the Invention

This invention relates generally to computer networks and more particularly to dispersing error encoded data.

Description of Related Art

Computing devices are known to communicate data, process data, and/or store data. Such computing devices range from wireless smart phones, laptops, tablets, personal computers (PC), work stations, and video game devices, to data centers that support millions of web searches, stock trades, or on-line purchases every day. In general, a computing device includes a central processing unit (CPU), a memory system, user input/output interfaces, peripheral device interfaces, and an interconnecting bus structure.

As is further known, a computer may effectively extend its CPU by using "cloud computing" to perform one or more computing functions (e.g., a service, an application, an algorithm, an arithmetic logic function, etc.) on behalf of the computer. Further, for large services, applications, and/or functions, cloud computing may be performed by multiple cloud computing resources in a distributed manner to improve the response time for completion of the service, application, and/or function. For example, Hadoop is an open source software framework that supports distributed applications enabling application execution by thousands of computers.

In addition to cloud computing, a computer may use "cloud storage" as part of its memory system. As is known, cloud storage enables a user, via its computer, to store files, applications, etc. on an Internet storage system. The Internet storage system may include a RAID (redundant array of independent disks) system and/or a dispersed storage system that uses an error correction scheme to encode data for storage.

BRIEF DESCRIPTION OF THE SEVERAL VIEWS OF THE DRAWING(S)

FIG. 3 is a schematic block diagram of an example of dispersed storage error encoding of data in accordance with the present invention;

FIG. 4 is a schematic block diagram of a generic example of an error encoding function in accordance with the present invention;

FIG. 5 is a schematic block diagram of a specific example of an error encoding function in accordance with the present invention;

FIG. 6 is a schematic block diagram of an example of a slice name of an encoded data slice (EDS) in accordance with the present invention;

FIG. 10 is a schematic block diagram of an example of a write request for an encoded data slice in accordance with the present invention;

FIG. 11 is a schematic block diagram of an example of a read request for an encoded data slice in accordance with the present invention;

FIG. 12 is a schematic block diagram of another example of overlapping write requests and read requests for a set of encoded data slices in accordance with the present invention;

DETAILED DESCRIPTION OF THE INVENTION

Figure 1:
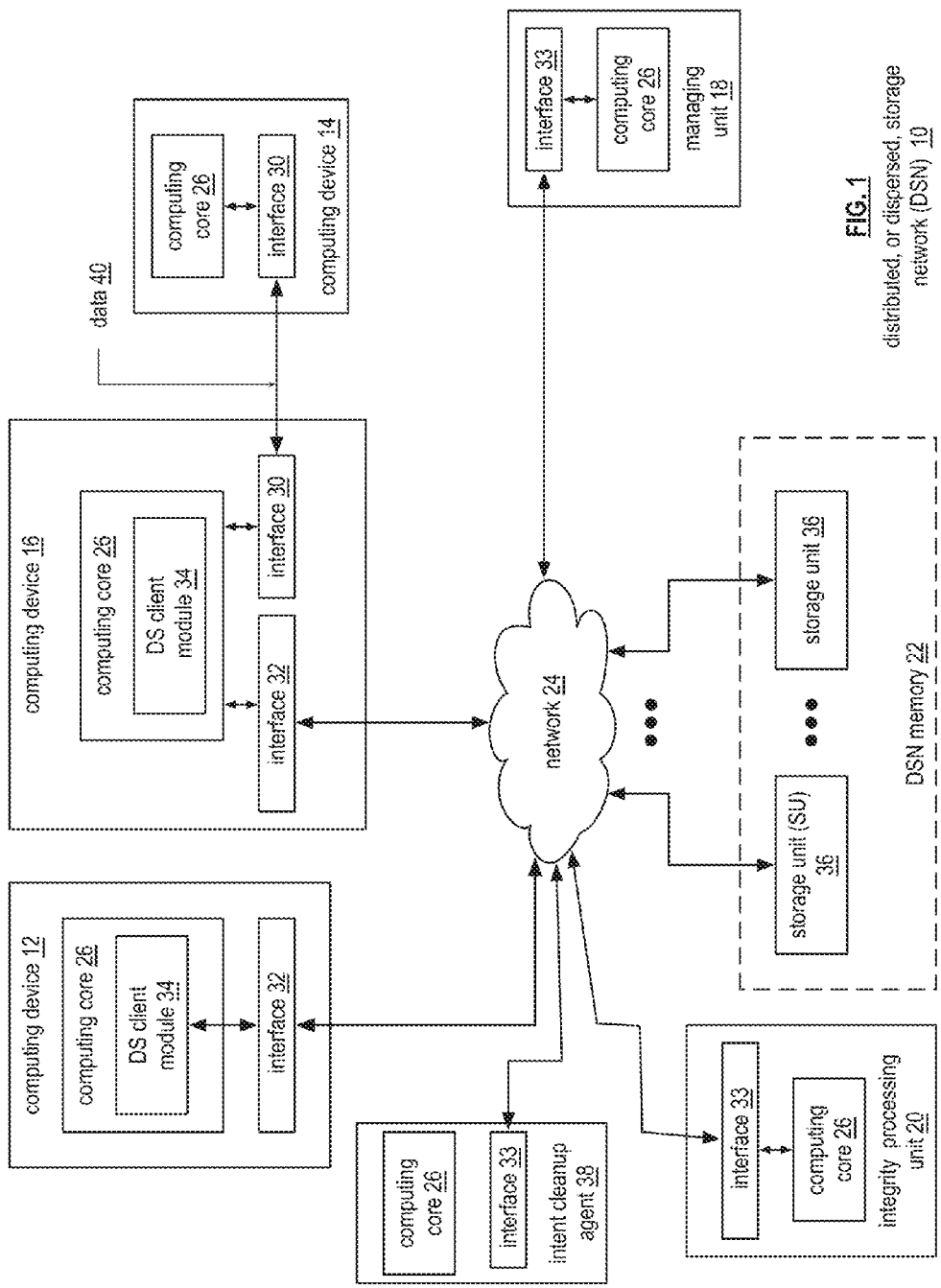
FIG. 1 is a schematic block diagram of an embodiment of a dispersed or distributed storage network (DSN) in accordance with the present invention.

FIG. 1 is a schematic block diagram of an embodiment of a dispersed, or distributed, storage network (DSN) 10 that includes a plurality of computing devices 12-16, a managing unit 18, an integrity processing unit 20, an intent cleanup agent 38 and a DSN memory 22. The components of the DSN 10 are coupled to a network 24, which may include one or more wireless and/or wire lined communication systems; one or more non-public intranet systems and/or public internet systems; and/or one or more local area networks (LAN) and/or wide area networks (WAN).

Figure 2:
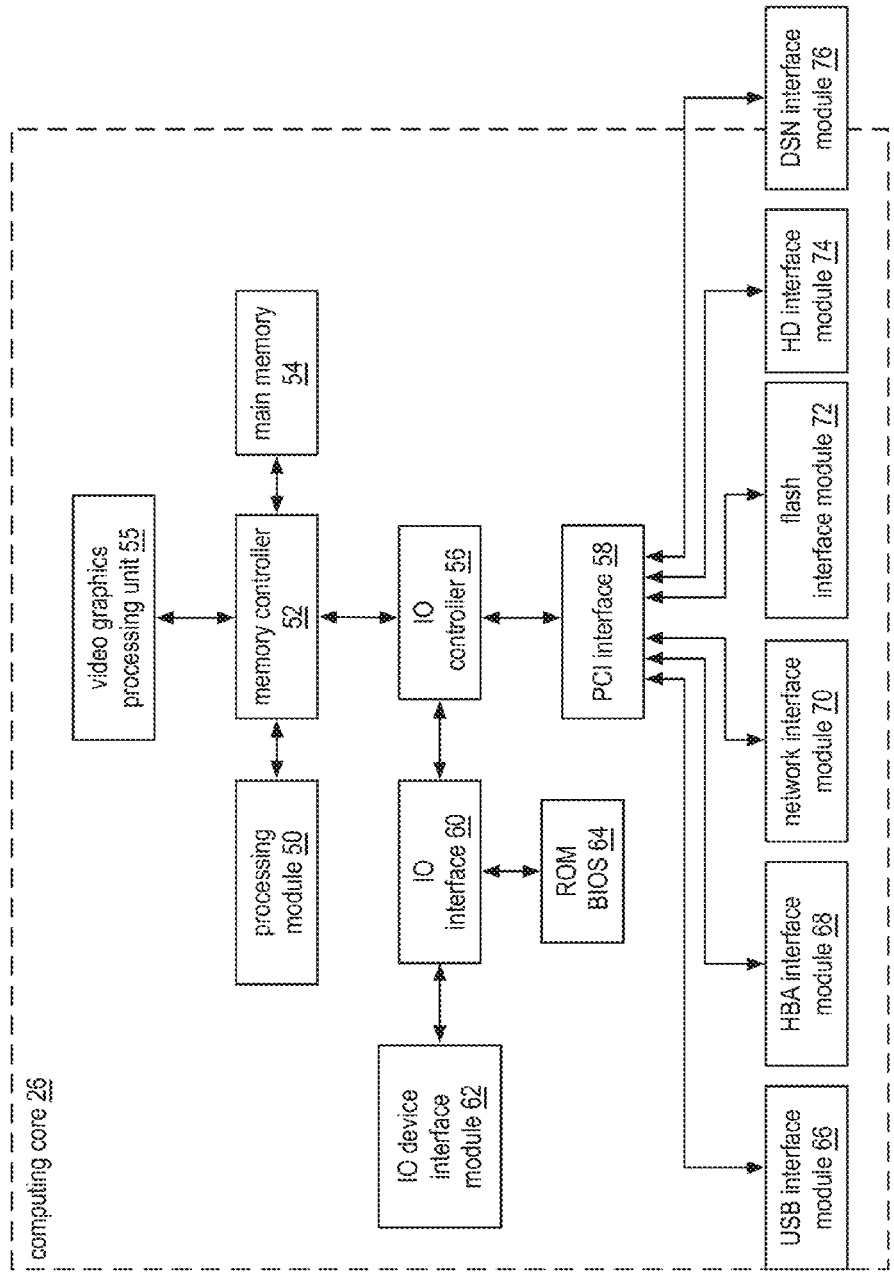
FIG. 2 is a schematic block diagram of an embodiment of a computing core in accordance with the present invention.

The DSN memory 22 includes a plurality of storage units 36 that may be located at geographically different sites (e.g., one in Chicago, one in Milwaukee, etc.), at a common site, or a combination thereof. For example, if the DSN memory 22 includes eight storage units 36, each storage unit is located at a different site. As another example, if the DSN memory 22 includes eight storage units 36, all eight storage units are located at the same site. As yet another example, if the DSN memory 22 includes eight storage units 36, a first pair of storage units are at a first common site, a second pair of storage units are at a second common site, a third pair of storage units are at a third common site, and a fourth pair of storage units are at a fourth common site. Note that a DSN memory 22 may include more or less than eight storage units 36. Further note that each storage unit 36 includes a computing core (as shown in FIG. 2, or components thereof) and a plurality of memory devices for storing dispersed error encoded data.

Each of the computing devices 12-16, the managing unit 18, and the integrity processing unit 20 include a computing core 26, which includes network interfaces 30-33. Computing devices 12-16 may each be a portable computing device and/or a fixed computing device. A portable computing device may be a social networking device, a gaming device, a cell phone, a smart phone, a digital assistant, a digital music player, a digital video player, a laptop computer, a handheld computer, a tablet, a video game controller, and/or any other portable device that includes a computing core. A fixed computing device may be a computer (PC), a computer server, a cable set-top box, a satellite receiver, a television set, a printer, a fax machine, home entertainment equipment, a video game console, and/or any type of home or office computing equipment. Note that each of the managing unit 18 and the integrity processing unit 20 may be separate computing devices, may be a common computing device, and/or may be integrated into one or more of the computing devices 12-16 and/or into one or more of the storage units 36.

Each interface 30, 32, and 33 includes software and hardware to support one or more communication links via the network 24 indirectly and/or directly. For example, interface 30 supports a communication link (e.g., wired, wireless, direct, via a LAN, via the network 24, etc.) between computing devices 14 and 16. As another example, interface 32 supports communication links (e.g., a wired connection, a wireless connection, a LAN connection, and/or any other type of connection to/from the network 24) between computing devices 12 and 16 and the DSN memory 22. As yet another example, interface 33 supports a communication link for each of the managing unit 18 and the integrity processing unit 20 to the network 24.

Computing devices 12 and 16 include a dispersed storage (DS) client module 34, which enables the computing device to dispersed storage error encode and decode data (e.g., data 40) as subsequently described with reference to one or more of FIGS. 3-8. In this example embodiment, computing device 16 functions as a dispersed storage processing agent for computing device 14. In this role, computing device 16 dispersed storage error encodes and decodes data on behalf of computing device 14. With the use of dispersed storage error encoding and decoding, the DSN 10 is tolerant of a significant number of storage unit failures (the number of failures is based on parameters of the dispersed storage error encoding function) without loss of data and without the need for a redundant or backup copies of the data. Further, the DSN 10 stores data for an indefinite period of time without data loss and in a secure manner (e.g., the system is very resistant to unauthorized attempts at accessing the data).

In operation, the managing unit 18 performs DS management services. For example, the managing unit 18 establishes distributed data storage parameters (e.g., vault creation, distributed storage parameters, security parameters, billing information, user profile information, etc.) for computing devices 12-14 individually or as part of a group of user devices. As a specific example, the managing unit 18 coordinates creation of a vault (e.g., a virtual memory block associated with a portion of an overall namespace of the DSN) within the DSN memory 22 for a user device, a group of devices, or for public access and establishes per vault dispersed storage (DS) error encoding parameters for a vault. The managing unit 18 facilitates storage of DS error encoding parameters for each vault by updating registry information of the DSN 10, where the registry information may be stored in the DSN memory 22, a computing device 12-16, the managing unit 18, and/or the integrity processing unit 20.

The managing unit 18 creates and stores user profile information (e.g., an access control list (ACL)) in local memory and/or within memory of the DSN memory 22. The user profile information includes authentication information, permissions, and/or the security parameters. The security parameters may include encryption/decryption scheme, one or more encryption keys, key generation scheme, and/or data encoding/decoding scheme.

The managing unit 18 creates billing information for a particular user, a user group, a vault access, public vault access, etc. For instance, the managing unit 18 tracks the number of times a user accesses a non-public vault and/or public vaults, which can be used to generate a per-access billing information. In another instance, the managing unit 18 tracks the amount of data stored and/or retrieved by a user device and/or a user group, which can be used to generate a per-data-amount billing information.

As another example, the managing unit 18 performs network operations, network administration, and/or network maintenance. Network operations includes authenticating user data allocation requests (e.g., read and/or write requests), managing creation of vaults, establishing authentication credentials for user devices, adding/deleting components (e.g., user devices, storage units, and/or computing devices with a DS client module 34) to/from the DSN 10, and/or establishing authentication credentials for the storage units 36. Network administration includes monitoring devices and/or units for failures, maintaining vault information, determining device and/or unit activation status, determining device and/or unit loading, and/or determining any other system level operation that affects the performance level of the DSN 10. Network maintenance includes facilitating replacing, upgrading, repairing, and/or expanding a device and/or unit of the DSN 10.

The integrity processing unit 20 performs rebuilding of 'bad' or missing encoded data slices. At a high level, the integrity processing unit 20 performs rebuilding by periodically attempting to retrieve/list encoded data slices, and/or slice names of the encoded data slices, from the DSN memory 22. For retrieved encoded slices, they are checked for errors due to data corruption, outdated version, etc. If a slice includes an error, it is flagged as a 'bad' slice. For encoded data slices that were not received and/or not listed, they are flagged as missing slices. Bad and/or missing slices are subsequently rebuilt using other retrieved encoded data slices that are deemed to be good slices to produce rebuilt slices. The rebuilt slices are stored in the DSN memory 22.

FIG. 2 is a schematic block diagram of an embodiment of a computing core 26 that includes a processing module 50, a memory controller 52, main memory 54, a video graphics processing unit 55, an input/output (TO) controller 56, a peripheral component interconnect (PCI) interface 58, an IO interface module 60, at least one IO device interface module 62, a read only memory (ROM) basic input output system (BIOS) 64, and one or more memory interface modules. The one or more memory interface module(s) includes one or more of a universal serial bus (USB) interface module 66, a host bus adapter (HBA) interface module 68, a network interface module 70, a flash interface module 72, a hard drive interface module 74, and a DSN interface module 76.

The DSN interface module 76 functions to mimic a conventional operating system (OS) file system interface (e.g., network file system (NFS), flash file system (FFS), disk file system (DFS), file transfer protocol (FTP), web-based distributed authoring and versioning (WebDAV), etc.) and/or a block memory interface (e.g., small computer system interface (SCSI), internet small computer system interface (iSCSI), etc.). The DSN interface module 76 and/or the network interface module 70 may function as one or more of the interface 30-33 of FIG. 1. Note that the IO device interface module 62 and/or the memory interface modules 66-76 may be collectively or individually referred to as IO ports.

FIG. 3 is a schematic block diagram of an example of dispersed storage error encoding of data. When a computing device 12 or 16 has data to store it disperse storage error encodes the data in accordance with a dispersed storage error encoding process based on dispersed storage error encoding parameters. The dispersed storage error encoding parameters include an encoding function (e.g., information dispersal algorithm, Reed-Solomon, Cauchy Reed-Solomon, systematic encoding, non-systematic encoding, on-line codes, etc.), a data segmenting protocol (e.g., data segment size, fixed, variable, etc.), and per data segment encoding values. The per data segment encoding values include a total, or pillar width, number (T) of encoded data slices per encoding of a data segment (i.e., in a set of encoded data slices); a decode threshold number (D) of encoded data slices of a set of encoded data slices that are needed to recover the data segment; a read threshold number (R) of encoded data slices to indicate a number of encoded data slices per set to be read from storage for decoding of the data segment; and/or a write threshold number (W) to indicate a number of encoded data slices per set that must be accurately stored before the encoded data segment is deemed to have been properly stored. The dispersed storage error encoding parameters may further include slicing information (e.g., the number of encoded data slices that will be created for each data segment) and/or slice security information (e.g., per encoded data slice encryption, compression, integrity checksum, etc.).

In the present example, Cauchy Reed-Solomon has been selected as the encoding function (a generic example is shown in FIG. 4 and a specific example is shown in FIG. 5); the data segmenting protocol is to divide the data object into fixed sized data segments; and the per data segment encoding values include: a pillar width of 5, a decode threshold of 3, a read threshold of 4, and a write threshold of 4. In accordance with the data segmenting protocol, the computing device 12 or 16 divides the data (e.g., a file (e.g., text, video, audio, etc.), a data object, or other data arrangement) into a plurality of fixed sized data segments (e.g., 1 through Y of a fixed size in range of Kilo-bytes to Tera-bytes or more). The number of data segments created is dependent of the size of the data and the data segmenting protocol.

The computing device 12 or 16 then disperse storage error encodes a data segment using the selected encoding function (e.g., Cauchy Reed-Solomon) to produce a set of encoded data slices. FIG. 4 illustrates a generic Cauchy Reed-Solomon encoding function, which includes an encoding matrix (EM), a data matrix (DM), and a coded matrix (CM). The size of the encoding matrix (EM) is dependent on the pillar width number (T) and the decode threshold number (D) of selected per data segment encoding values. To produce the data matrix (DM), the data segment is divided into a plurality of data blocks and the data blocks are arranged into D number of rows with Z data blocks per row. Note that Z is a function of the number of data blocks created from the data segment and the decode threshold number (D). The coded matrix is produced by matrix multiplying the data matrix by the encoding matrix.

FIG. 5 illustrates a specific example of Cauchy Reed-Solomon encoding with a pillar number (T) of five and decode threshold number of three. In this example, a first data segment is divided into twelve data blocks (D1-D12). The coded matrix includes five rows of coded data blocks, where the first row of X11-X14 corresponds to a first encoded data slice (EDS 1_1), the second row of X21-X24 corresponds to a second encoded data slice (EDS 2_1), the third row of X31-X34 corresponds to a third encoded data slice (EDS 3_1), the fourth row of X41-X44 corresponds to a fourth encoded data slice (EDS 4_1), and the fifth row of X51-X54 corresponds to a fifth encoded data slice (EDS 5_1). Note that the second number of the EDS designation corresponds to the data segment number.

Returning to the discussion of FIG. 3, the computing device also creates a slice name (SN) for each encoded data slice (EDS) in the set of encoded data slices. A typical format for a slice name 80 is shown in FIG. 6. As shown, the slice name (SN) 80 includes a pillar number of the encoded data slice (e.g., one of 1-T), a data segment number (e.g., one of 1-Y), a vault identifier (ID), a data object identifier (ID), and may further include revision level information of the encoded data slices. The slice name functions as, at least part of, a DSN address for the encoded data slice for storage and retrieval from the DSN memory 22.

As a result of encoding, the computing device 12 or 16 produces a plurality of sets of encoded data slices, which are provided with their respective slice names to the storage units for storage. As shown, the first set of encoded data slices includes EDS 1_1 through EDS 5_1 and the first set of slice names includes SN 1_1 through SN 5_1 and the last set of encoded data slices includes EDS 1_Y through EDS 5_Y and the last set of slice names includes SN 1_Y through SN 5_Y.

Figure 7:
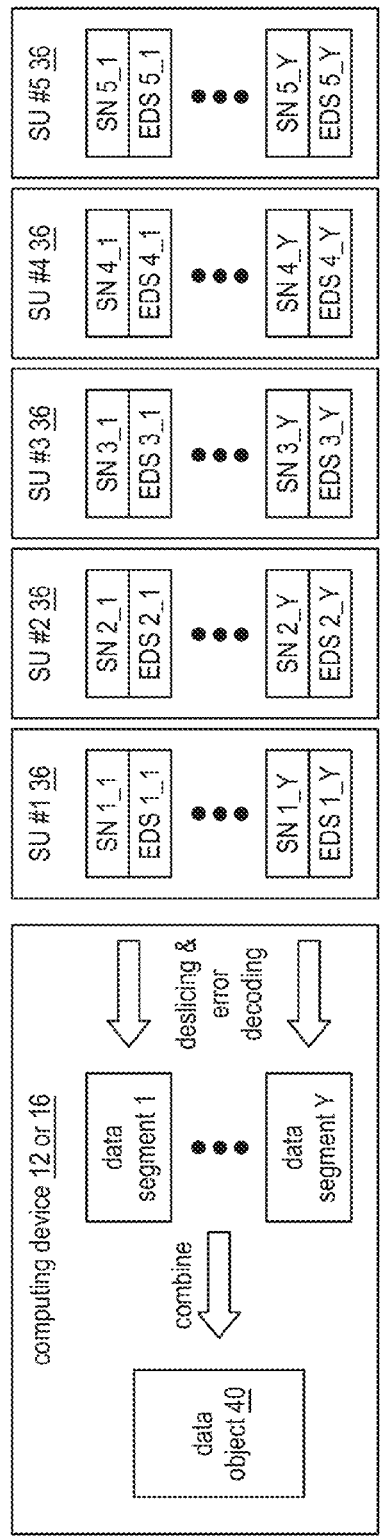
FIG. 7 is a schematic block diagram of an example of dispersed storage error decoding of data in accordance with the present invention.

FIG. 7 is a schematic block diagram of an example of dispersed storage error decoding of a data object that was dispersed storage error encoded and stored in the example of FIG. 4. In this example, the computing device 12 or 16 retrieves from the storage units at least the decode threshold number of encoded data slices per data segment. As a specific example, the computing device retrieves a read threshold number of encoded data slices.

Figure 8:
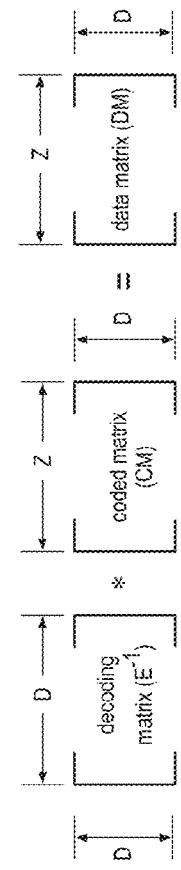
FIG. 8 is a schematic block diagram of a generic example of an error decoding function in accordance with the present invention.

To recover a data segment from a decode threshold number of encoded data slices, the computing device uses a decoding function as shown in FIG. 8. As shown, the decoding function is essentially an inverse of the encoding function of FIG. 4. The coded matrix includes a decode threshold number of rows (e.g., three in this example) and the decoding matrix in an inversion of the encoding matrix that includes the corresponding rows of the coded matrix. For example, if the coded matrix includes rows 1, 2, and 4, the encoding matrix is reduced to rows 1, 2, and 4, and then inverted to produce the decoding matrix.

Figure 9:
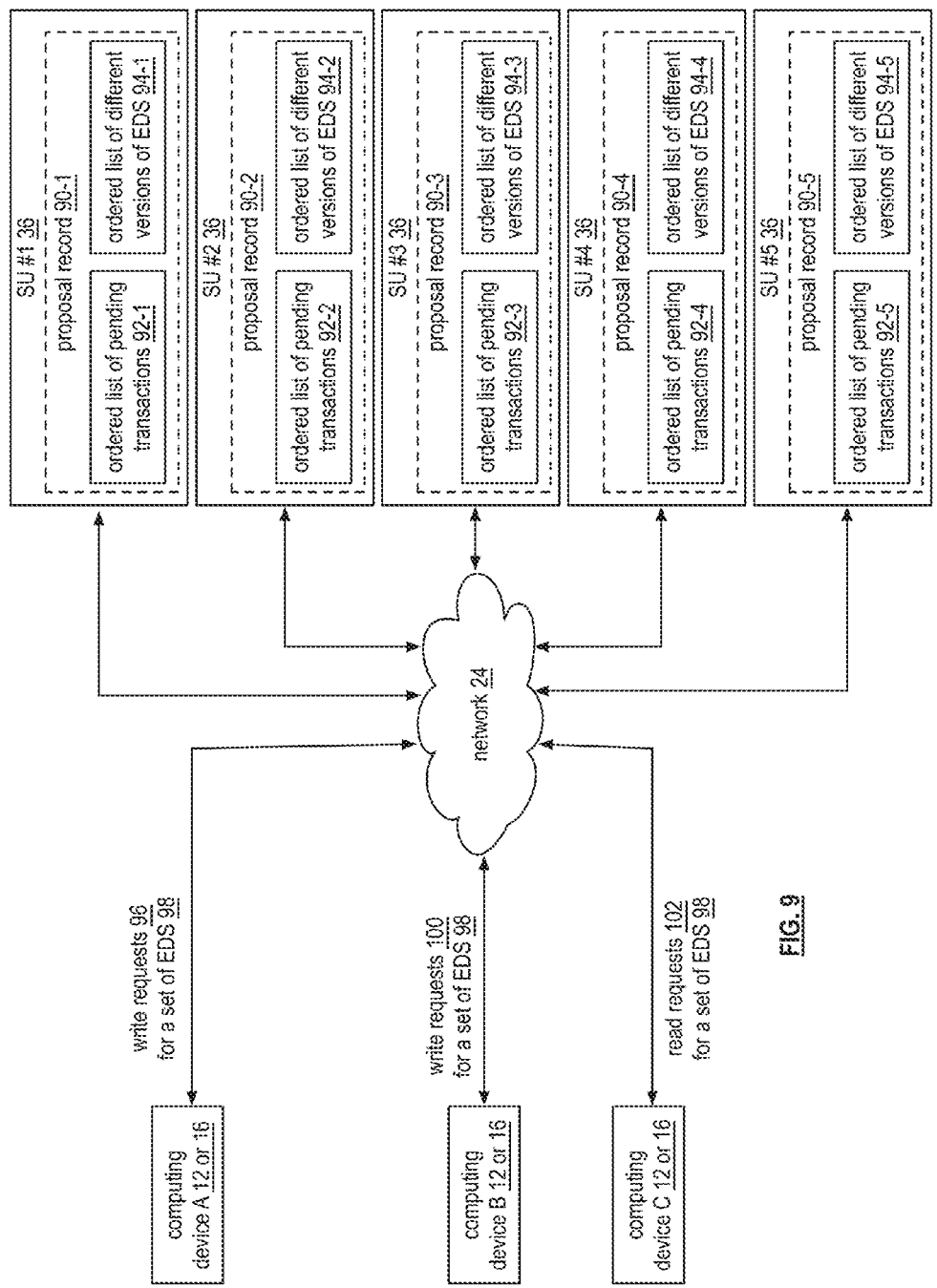
FIG. 9 is a schematic block diagram of an example of overlapping write requests for a set of encoded data slices in accordance with the present invention.

FIG. 9 is a schematic block diagram of an example of overlapping write requests for a set of encoded data slices having the same set of slice names. Overlapping write requests occur when one set of write requests is pending (e.g., write finalize commands have not yet been issued) and another set of write requests for a set of encoded data slices having the same set of slice names is received by the storage units. In this example, computing devices A and B send overlapping write requests regarding a set of encoded data slices with the same set of slices names.

To process overlapping write requests (and other overlapping data access requests), each storage unit 36 (SU#1-SU#5) stores its own proposal record 90-1 through 90-5 for a slice name or for a group of slice names. A proposal record 90 includes an order listed of pending transactions 92 and an ordered list of visible and different versions of an encoded data slice (EDS) 94 have the same slice name. The proposal record 90 may further include an indication of the current revision level of the encoded data slice.

The ordered list of pending transactions 92 include a time ordered list of transaction numbers, or other indication, associated with data access requests regarding the slice name that were received while the proposal record is open (e.g., write finalize commands have not yet been issued for one of the pending write requests). For example, the proposal record 90-1 of storage unit #1 includes an ordered list of transaction numbers for data access requests regarding a first slice name of a set of slice names.

As a specific example, a first write request from computing device A regarding a version of an encoded data slice having the first slice name has a first transaction number (e.g., 0413) and a second write request from computing device B regarding another version of the encoded data slice having the first slice name has a second transaction number (e.g., 0279). Storage unit #1 received the first write request before receiving the second write request, as such the proposal record 90-1 has the first write request (e.g., the first transaction number) in a first priority position and the second write request in a second priority position.

As another specific example, a write request from computing device A regarding a version of an encoded data slice having a second slice name has the first transaction number (e.g., 0413) and a write request from computing device B regarding another version of the encoded data slice having the second slice name has the second transaction number (e.g., 0279). Storage unit #2 received the write request from computing device B before receiving the write request from computing device A. As such, the proposal record 90-2 has the write request of computing device B (e.g., the second transaction number) in the first priority position and the write request from computing device A in a second priority position. The remaining storage units generate their respective proposal records in a similar manner.

In general, a storage unit "opens" a proposal record when it receives a new write request for a version of an encoded data slice having a slice name (i.e., no other write requests are pending). The storage unit sends to proposal record to the computing device sending the write request. If there are no overlapping write requests for a set of encoded data slices having a set of slice names, then the other storage units (SU #2-SU#5) open up proposal records and send them to the computing device.

The computing device interprets the proposal records to determine whether a threshold number, or more, (e.g., decode threshold number, write threshold number, etc.) of its write requests is in the first priority position. When there is not an overlapping write request, the write requests will be in the first priority position. As such, the computing device sends finalize requests to the storage units. The storage units process the finalize request to make the new version of the encoded data slices as the most recent set of encoded data slices and close their respective proposal records.

When there is an overlapping write request (e.g., a storage unit has an open proposal record for the slice name), the storage unit updates the proposal record with the new write request by placing the new write request is a lower priority position than previously received and pending write requests. After updating the proposal record, the storage unit sends the proposal record to the computing device that sent the new write request.

As the computing devices receive the proposal records, it determines whether at least the threshold number of their respective write requests are in first priority position. If yes, the computing device issues the finalize commands. If not, the computing device withdraws it write requests or executes some other fallback position.

In addition to the two write requests, computing device C is sending read requests to the storage units for the set of encoded data slices 98. The storage units add the read requests to their respective proposal records and send the updated proposal records to computing device C. Upon receiving the proposal records, computing device C determines whether to proceed with the read request (e.g., read the current revision level of the set of encoded data slices) or terminate the read request. As an alternative, computing device C processes the proposal records to determine that the new set of encoded data slices from computing device A or computing device B will be the next current version of the set of encoded data slices. Having made this determination, computing device C modifies its read requests to read the next current version of the set of encoded data slices.

FIG. 10 is a schematic block diagram of an example of a write request 96 or 100 that of FIG. 9. The write request includes a transaction number field, a slice name (SN) field, an encoded data slice (EDS) field, a current revision level field, and a new revision level field. Each write request in the set of write requests includes the same transaction number, a different slice name, a different EDS, the same current revision level, and the same new revision level.

FIG. 11 is a schematic block diagram of an example of a read request 102 of FIG. 9. The read request includes a transaction number field, a slice name (SN) field, and a current revision level field. Each read request in the set of read requests 102 includes the same transaction number, a different slice name, and the same current revision level.

FIG. 12 is a schematic block diagram of another example of overlapping write requests 96, 100 and read requests 102 for a set of encoded data slices 98. In this example, each of computing devices A and B encoded data segment into a set of five encoded data slices. Accordingly, each of computing devices A and B generates five write requests 96-1 through 96-5 and 100-1 through 100-5. The write requests from computing device A include the same transaction number of 0413 (which may be randomly generated, may be a time stamp, etc.), differing slice names (SN 1_1 through SN 5_1), differing encoded data slices (EDS A_1_1 through EDS A_5_1), the same current revision level of 003, and the next revision level of 004.

The write requests form computing device B include the same transaction number of 0279, differing slice names (SN 1_1 through SN 5_1), differing encoded data slices (EDS B_1_1 through EDS B_5_1), the same current revision level of 003, and the next revision level of 004. A comparison of the write requests from computing device A with the write requests from computing device B yields that the write requests have the same slice names, the same current revision levels, and the same next revision levels. The write requests differ in the transaction numbers and in the encoded data slices.

Computing device C issues five read requests for the set of encoded data slices 98. The read requests 102-1 through 102-5 includes the same transaction number of 03338, different slice names (SN 1_1 through SN 5_1), and the current revision level of 003. The write requests and the read requests are sent to the storage units SU1 through SU5, which processes the requests as discussed with reference to FIG. 13.

Figure 13:
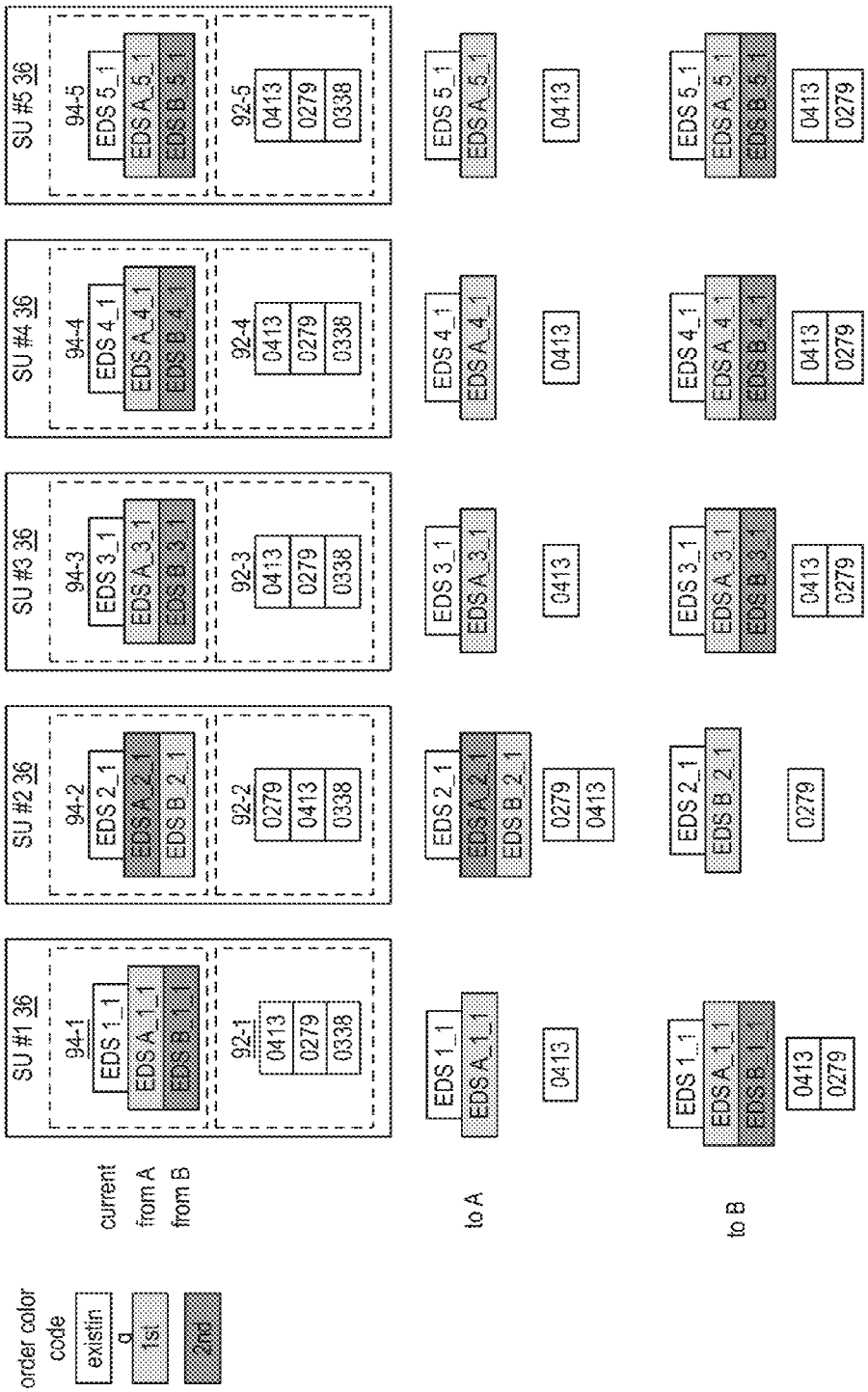
FIG. 13 is a schematic block diagram of an example of proposal records for a set of encoded data slices stored by storage units of the DSN in accordance with the present invention.

FIG. 13 is a schematic block diagram of an example of proposal records for a set of encoded data slices stored by storage units of the DSN. In this example, while the write requests 96 and 100 and the read requests 102 are sent out at similar times, due to differing latencies and/or processing capabilities between the computing devices and storage units, the requests are received at different times and, potentially in a different order, by the storage units than the order in which they were transmitted.

Prior to the reception of any of the read or write requests, the storage units store a current revision level of the set of encoded data slices. As shown, storage unit SU#1 stores EDS 1_1, storage unit SU#2 stores EDS 2_1, and so on. In this example, the current revision level of the encoded data slices is 003. In addition, each of the storage units do not have a proposal record open for their respective encoded data slice.

In this example, when a storage unit receives a data access request, it opens a proposal record that identifies the data access it just received, the current revision level, and an indication that the current revision level of the encoded data slice is visible (e.g., can be accessed by a computing device of the DSN). Upon opening a proposal record, the storage unit sends it to the computing device from which it received the request.

For example, each of storage units 1, 3, 4, and 5 received the write request from computing device A first. Accordingly, each storage unit creates a proposal record that includes the ordered list of pending transactions 92 and the order list of visible different versions of EDS 94, which is sent to computing device A. For instance, each of the ordered list of pending transactions 92-1, 92-3, 92-4, and 92-5 include the transaction number of 0413 (the transaction number for the write requests of computing device A) in the first priority position. Further, each of the order list of visible different versions of EDS 94-1, 94-3, 94-4, and 94-5 includes an indication that the current revision level of the encoded data slice and the encoded data slice from computing device A are visible (e.g., for SU #1, EDS 1_1 and EDS A_1_1 are visible).

Continuing with the example, storage unit #2 receives the write request from computing device B first. Accordingly, storage unit #2 creates a proposal record that includes the ordered list of pending transactions 92-2 and the order list of visible different versions of EDS 94-4, which is sent to computing device B. For instance, the ordered list of pending transactions 92-2 includes the transaction number of 0279 (the transaction number for the write requests of computing device B) in the first priority position. Further, the order list of visible different versions of EDS 94-2 includes an indication that the current revision level of the encoded data slice and the encoded data slice from computing device B are visible (e.g., EDS 2_1 and EDS B_2_1 are visible).

After receiving the write requests from computing device A, storage units 1, 3, 4, and 5 receive the write request from computing device B. Accordingly, each storage unit updates its proposal record, which are sent to computing device A. For instance, each of the ordered list of pending transactions 92-1, 92-3, 92-4, and 92-5 are updated to include the transaction number of 0279 (the transaction number for the write requests of computing device B) in the second priority position. Further, each of the order list of visible different versions of EDS 94-1, 94-3, 94-4, and 94-5 are updated to include an indication that the current revision level of the encoded data slice and the encoded data slices from computing devices A and B are visible (e.g., for SU #1, EDS 1_1 EDS A_1_1, and EDS B_1_1 are visible).

After receiving the write requests from computing device B, storage unit 2 receives the write request from computing device A. Accordingly, storage unit #2 updates its proposal record, which is sent to computing device B. For instance, the ordered list of pending transactions 92-2 includes the transaction number of 0413 (the transaction number for the write requests of computing device A) in the second priority position. Further, the order list of visible different versions of EDS 94-2 includes an indication that the current revision level of the encoded data slice and the encoded data slices from computing devices A and B are visible (e.g., EDS 2_1, EDS B_2_1, and EDS A_2_1 are visible).

After receiving the write requests from both computing devices A and B and prior to closing the proposal records, the storage units receive read requests from computing device C. Accordingly, each of the storage units updates its proposal record to include the read request. In particular, each storage unit updates its order list of pending transaction 92 to include the transaction number 0279 of the read requests in the third priority position. The update proposal records are sent to computing device C.

Updates to a plurality of encoded data slices can be achieved as part of a single transaction. These operations, often described as "atomic operations" can be executed without any other process being able to read or change state (other than the read or change being updated) during the operation. Atomic operations are effectively executed as a single step, and can be an important attribute in systems where a plurality of algorithms deal with multiple independent processes (for algorithms that update shared data without requiring synchronization and those that do need synchronization). A normal atomic write operation can be executed as follows: 1) a DS processor acquires a lock on the metadata associated with a data object; 2) the DS processing unit writes the object into memory; 3) the DS processing unit updates the metadata associated with the data object with a quota usage for the container in which the data object is written; 4) if the quota update to the metadata associated with the data object is unsuccessful the data object is deleted from memory; and 5) the DS processing unit releases the lock on the metadata associated with the data object.

In this instance, the atomic operation enforces that all updates being made in a current transaction are immediately consistent; if any failures occur during the update the entire transaction is aborted and any objects already written are rolled back. Atomic operations, such as that described above, can result in contention for metadata associated with a data object if there are multiple writes in the same container, in addition to inefficiency related to deletion of an already written data object because the associated metadata update was unsuccessful.

The DSN protocol enables single-element atomic "compare and swap of 1 element" (CAS-1), where a data source may be atomically incremented in an atomic transactional operation. Supporting multiple (arbitrary N) atomic compare and swap (CAS-N) transactions requires extensions to the DSN protocol, which are accomplished by using the protocol to enable N-Element compare and swap (CAS-N). CAS-N provides strong consistency among arbitrary elements with atomic read visibility. A CAS-N transaction consists of a set of "proposals" which take the form (SOURCE, OLD REVISION, NEW REVISION), where each proposal's revision comparisons must be atomically satisfied in order for the transaction to complete, and if any fail no update to any source is made. This is accomplished by storing the complete "transaction description"—(the set of all proposals) in each data location (for example, on each participating ds unit holding a slice of at least one of the sources within the CAS-N operation) at least for the duration the transaction. Any reader or writer that encounters a source with an ongoing (open) transaction must then validate the entire transaction's proposals before deciding whether the NEW REVISION or OLD REVISION is visible for that source. In some cases, this may require a client to issue additional read requests for previously unknown sources that are referenced within the transaction description. When a CAS-N transaction is complete, the transaction description can be removed from all participating ds units, and at such time the NEW REVISION of each source is visible.

Figure 14:
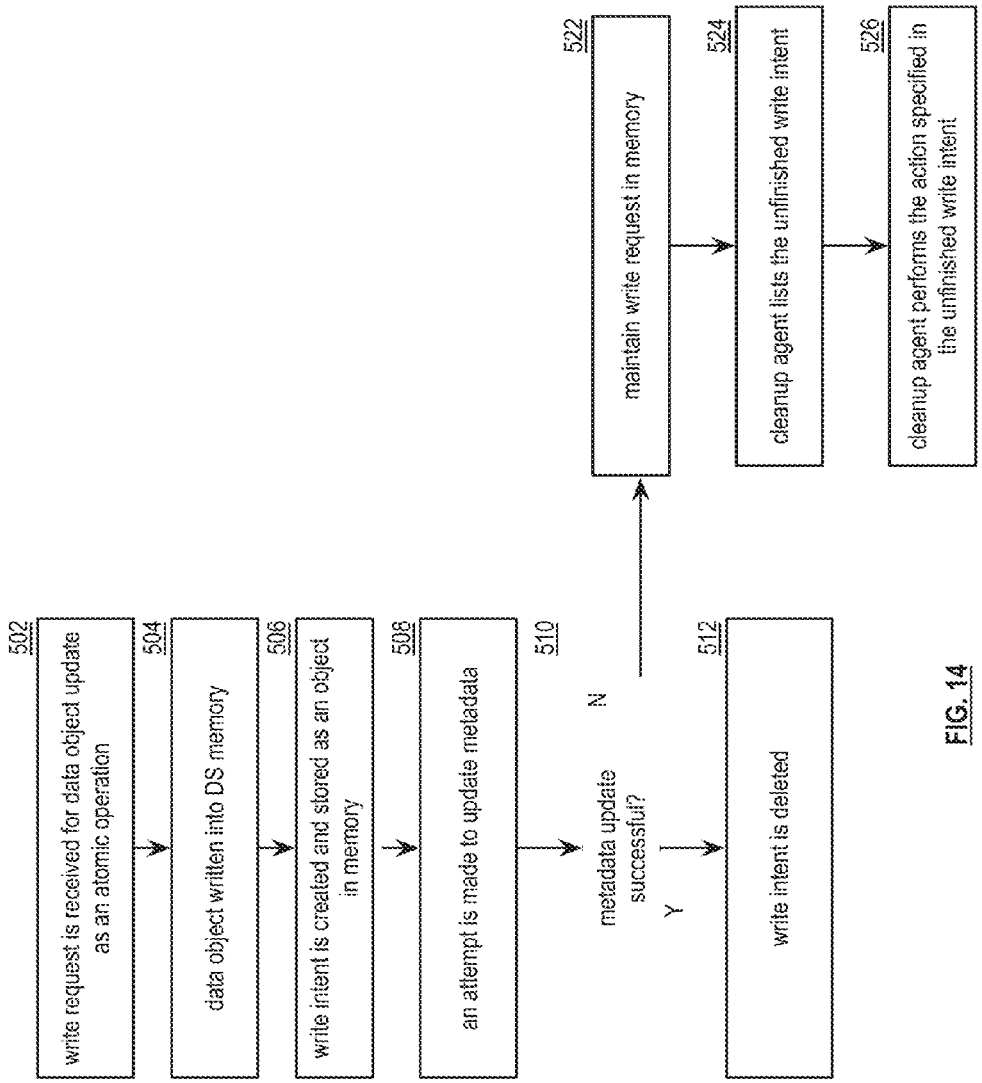
FIG. 14 is a logic diagram of an example of a method of using a write intent in an atomic write request for a set of encoded data slices in accordance with the present invention.

FIG. 14 is a logic diagram of an example of a method of using a write intent in an atomic write request for a set of encoded data slices. In step 502 a write request is received to update, in a single transaction, a plurality of encoded data slices associated with a data object. The data object is written into DS memory in step 504 and a write intent is created as an object in memory to represent the state of the stored data object as intended after the write intent is executed. In practice a write intent will include quota limits for the container in which a data object is intended to be stored. The container is a virtual (and/or physical) representation of memory, where the container is subject to quota limits. Quota limits can include a limit on the aggregate number of objects that can be stored in the container, the total number of bytes available in the container or other objective limits on container storage. The write intent is stored as an object in the DS memory and would provide the necessary quota information for the data objects intended to be written. Write intents can thus be used to guarantee the consistency of the independent objects in an atomic write request by representing the eventual intended state(s) of independent data objects before executing the intent.

A user or client would use CAS-N with a write intent to write or update a particular object in DS Memory along with an immediate consistency update. Returning to FIG. 14, in step 508 an attempt is made to update the container metadata, if the metadata update is successful (step 510) the write intent is deleted. If the attempt to update metadata is unsuccessful, the write request is maintained in memory in step 522. An independent service executed on the DSN called an intent cleanup agent 38 of FIG. 1 ("cleanup agent") is used to periodically find and list unfinished write intents (write intents that were stored and metadata updates were unsuccessful). The cleanup agent is then used to execute the storage action of an unfinished write intent, thereby maintaining consistency of a subject data object.

Similar to the quota usage for containers, each tenant (or user) of a particular container will likewise be limited to storage quotas (storage bytes and object count quotas), as described above. The storage quotas for tenants are stored in separate metadata for each tenant. The DS processing unit can use the tenant metadata to maintain consistency between objects written to a container, container metadata and tenant metadata.

It is noted that terminologies as may be used herein such as bit stream, stream, signal sequence, etc. (or their equivalents) have been used interchangeably to describe digital information whose content corresponds to any of a number of desired types (e.g., data, video, speech, audio, etc. any of which may generally be referred to as 'data').

As may be used herein, the terms "substantially" and "approximately" provides an industry-accepted tolerance for its corresponding term and/or relativity between items. Such an industry-accepted tolerance ranges from less than one percent to fifty percent and corresponds to, but is not limited to, component values, integrated circuit process variations, temperature variations, rise and fall times, and/or thermal noise. Such relativity between items ranges from a difference of a few percent to magnitude differences. As may also be used herein, the term(s) "configured to", "operably coupled to", "coupled to", and/or "coupling" includes direct coupling between items and/or indirect coupling between items via an intervening item (e.g., an item includes, but is not limited to, a component, an element, a circuit, and/or a module) where, for an example of indirect coupling, the intervening item does not modify the information of a signal but may adjust its current level, voltage level, and/or power level. As may further be used herein, inferred coupling (i.e., where one element is coupled to another element by inference) includes direct and indirect coupling between two items in the same manner as "coupled to". As may even further be used herein, the term "configured to", "operable to", "coupled to", or "operably coupled to" indicates that an item includes one or more of power connections, input(s), output(s), etc., to perform, when activated, one or more its corresponding functions and may further include inferred coupling to one or more other items. As may still further be used herein, the term "associated with", includes direct and/or indirect coupling of separate items and/or one item being embedded within another item.

As may be used herein, the term "compares favorably", indicates that a comparison between two or more items, signals, etc., provides a desired relationship. For example, when the desired relationship is that signal 1 has a greater magnitude than signal 2, a favorable comparison may be achieved when the magnitude of signal 1 is greater than that of signal 2 or when the magnitude of signal 2 is less than that of signal 1. As may be used herein, the term "compares unfavorably", indicates that a comparison between two or more items, signals, etc., fails to provide the desired relationship.

As may also be used herein, the terms "processing module", "processing circuit", "processor", and/or "processing unit" may be a single processing device or a plurality of processing devices. Such a processing device may be a microprocessor, micro-controller, digital signal processor, microcomputer, central processing unit, field programmable gate array, programmable logic device, state machine, logic circuitry, analog circuitry, digital circuitry, and/or any device that manipulates signals (analog and/or digital) based on hard coding of the circuitry and/or operational instructions. The processing module, module, processing circuit, and/or processing unit may be, or further include, memory and/or an integrated memory element, which may be a single memory device, a plurality of memory devices, and/or embedded circuitry of another processing module, module, processing circuit, and/or processing unit. Such a memory device may be a read-only memory, random access memory, volatile memory, non-volatile memory, static memory, dynamic memory, flash memory, cache memory, and/or any device that stores digital information. Note that if the processing module, module, processing circuit, and/or processing unit includes more than one processing device, the processing devices may be centrally located (e.g., directly coupled together via a wired and/or wireless bus structure) or may be distributedly located (e.g., cloud computing via indirect coupling via a local area network and/or a wide area network). Further note that if the processing module, module, processing circuit, and/or processing unit implements one or more of its functions via a state machine, analog circuitry, digital circuitry, and/or logic circuitry, the memory and/or memory element storing the corresponding operational instructions may be embedded within, or external to, the circuitry comprising the state machine, analog circuitry, digital circuitry, and/or logic circuitry. Still further note that, the memory element may store, and the processing module, module, processing circuit, and/or processing unit executes, hard coded and/or operational instructions corresponding to at least some of the steps and/or functions illustrated in one or more of the Figures. Such a memory device or memory element can be included in an article of manufacture.

One or more embodiments have been described above with the aid of method steps illustrating the performance of specified functions and relationships thereof. The boundaries and sequence of these functional building blocks and method steps have been arbitrarily defined herein for convenience of description. Alternate boundaries and sequences can be defined so long as the specified functions and relationships are appropriately performed. Any such alternate boundaries or sequences are thus within the scope and spirit of the claims. Further, the boundaries of these functional building blocks have been arbitrarily defined for convenience of description. Alternate boundaries could be defined as long as the certain significant functions are appropriately performed. Similarly, flow diagram blocks may also have been arbitrarily defined herein to illustrate certain significant functionality.

To the extent used, the flow diagram block boundaries and sequence could have been defined otherwise and still perform the certain significant functionality. Such alternate definitions of both functional building blocks and flow diagram blocks and sequences are thus within the scope and spirit of the claims. One of average skill in the art will also recognize that the functional building blocks, and other illustrative blocks, modules and components herein, can be implemented as illustrated or by discrete components, application specific integrated circuits, processors executing appropriate software and the like or any combination thereof.

In addition, a flow diagram may include a "start" and/or "continue" indication. The "start" and "continue" indications reflect that the steps presented can optionally be incorporated in or otherwise used in conjunction with other routines. In this context, "start" indicates the beginning of the first step presented and may be preceded by other activities not specifically shown. Further, the "continue" indication reflects that the steps presented may be performed multiple times and/or may be succeeded by other activities not specifically shown. Further, while a flow diagram indicates a particular ordering of steps, other orderings are likewise possible provided that the principles of causality are maintained.

The one or more embodiments are used herein to illustrate one or more aspects, one or more features, one or more concepts, and/or one or more examples. A physical embodiment of an apparatus, an article of manufacture, a machine, and/or of a process may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

Unless specifically stated to the contra, signals to, from, and/or between elements in a figure of any of the figures presented herein may be analog or digital, continuous time or discrete time, and single-ended or differential. For instance, if a signal path is shown as a single-ended path, it also represents a differential signal path. Similarly, if a signal path is shown as a differential path, it also represents a single-ended signal path. While one or more particular architectures are described herein, other architectures can likewise be implemented that use one or more data buses not expressly shown, direct connectivity between elements, and/or indirect coupling between other elements as recognized by one of average skill in the art.

The term "module" is used in the description of one or more of the embodiments. A module implements one or more functions via a device such as a processor or other processing device or other hardware that may include or operate in association with a memory that stores operational instructions. A module may operate independently and/or in conjunction with software and/or firmware. As also used herein, a module may contain one or more sub-modules, each of which may be one or more modules.

As may further be used herein, a computer readable memory includes one or more memory elements. A memory element may be a separate memory device, multiple memory devices, or a set of memory locations within a memory device. Such a memory device may be a read-only memory, random access memory, volatile memory, non-volatile memory, static memory, dynamic memory, flash memory, cache memory, and/or any device that stores digital information. The memory device may be in a form a solid state memory, a hard drive memory, cloud memory, thumb drive, server memory, computing device memory, and/or other physical medium for storing digital information.

While particular combinations of various functions and features of the one or more embodiments have been expressly described herein, other combinations of these features and functions are likewise possible. The present disclosure is not limited by the particular examples disclosed herein and expressly incorporates these other combinations.

What is claimed is:

1. A method comprises:
   receiving, by a computing device, a write request intended for one or more storage units of a dispersed storage network (DSN), wherein the write request is for data segment that has been encoded to produce a set of encoded data slices;
   storing the write request in memory;
   creating a write intent associated with the write request, wherein the write intent includes information about storage of the set of encoded data slices;
   determining whether metadata associated with the write request can be successfully updated;
   when the metadata associated with the write request can be successfully updated, deleting the write intent associated with the write request;
   when the metadata associated with the write request cannot be successfully updated, maintaining the write request in memory until a cleanup agent can execute the write request; and
   executing the write request using the write intent associated with the write request.

2. The method of claim 1 further comprises:
   listing, by the cleanup agent, the unfinished write intent before executing the write request.

3. The method of claim 1, wherein the metadata includes a quota limit for the number of objects permitted for storage in a container.

4. The method of claim 1, wherein the metadata includes a quota limit for the amount of data permitted for storage in a container.

5. The method of claim 1, wherein the write request is an atomic transactional operation.

6. The method of claim 5, wherein the atomic transactional operation is a multi-element compare and swap.

7. The method of claim 1, wherein the write intent includes at least one of: changes in data segment size or changes in number of object.

8. The method of claim 1, wherein the metadata includes information associated with a particular DSN user.

9. The method of claim 1, wherein the write intent includes quota limit information for a particular DSN user.

10. A computing device comprises:
an interface for interfacing with a network;
memory; and
a processing module operably coupled to the interface and to the memory, wherein the processing module is operable to:
receive, by a computing device, a write request intended for one or more storage units of a dispersed storage network (DSN), wherein the write request is for data segment that has been encoded to produce a set of encoded data slices;
store the write request in memory;
create a write intent associated with the write request, wherein the write intent includes information about storage of the set of encoded data slices;
determine whether metadata associated with the write request can be successfully updated;
when the metadata associated with the write request can be successfully updated, deleting the write intent associated with the write request;
when the metadata associated with the write request cannot be successfully updated, maintain the write request in memory until a cleanup agent can execute the write request; and
execute the write request using the write intent associated with the write request.

11. The computing device of claim 10 wherein the processing module is further operable to: list, by the cleanup agent, the unfinished write intent before executing the write request.

12. The computing device of claim 10, wherein the metadata includes a quota limit for the number of objects permitted for storage in a container.

13. The computing device of claim 10, wherein the metadata includes a quota limit for the amount of data permitted for storage in a container.

14. The computing device of claim 10, wherein the write request is an atomic transactional operation.

15. The computing device of claim 14, wherein the atomic transactional operation is a multi-element compare and swap operation.

16. The computing device of claim 10, wherein the write intent includes at least one of: changes in data segment size or changes in number of object.

17. The computing device of claim 10, wherein the metadata includes information associated with a user.

18. The computing device of claim 10, wherein the write intent includes quota limit information for a particular DSN user.

19. A method performed in a distributed storage (DS) unit of a distributed storage network (DSN), the method comprises:
receiving a write request from the dispersed storage network (DSN), wherein the write request is for data segment that has been encoded to produce a set of encoded data slices;
storing the write request in memory;
creating a write intent associated with the write request, wherein the write intent includes information about storage of the set of encoded data slices;
determining whether metadata associated with the write request can be successfully updated;
when the metadata associated with the write request can be successfully updated, deleting the write intent associated with the write request;
when the metadata associated with the write request cannot be successfully updated, maintaining the write request in memory until a cleanup agent can execute the write request; and
executing the write request using the write intent associated with the write request.

20. The method of claim 19, wherein the write request is an atomic transactional operation.

* * * * *